(12) United States Patent
Chen

(10) Patent No.: US 7,742,142 B2
(45) Date of Patent: Jun. 22, 2010

(54) DISPLAY AND TAPE CARRIER PACKAGE STRUCTURE

(75) Inventor: Po-Lung Chen, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 888 days.

(21) Appl. No.: 11/161,588

(22) Filed: Aug. 9, 2005

(65) Prior Publication Data

US 2007/0035690 A1 Feb. 15, 2007

(51) Int. Cl.
G02F 1/1345 (2006.01)
H01L 23/495 (2006.01)

(52) U.S. Cl. .................. 349/150; 349/149; 257/668

(58) Field of Classification Search .................. 349/150; 174/255; 257/668
See application file for complete search history.

(56) References Cited

U.S. PATENT DOCUMENTS

| | | | | |
|---|---|---|---|---|
| 5,288,950 | A | * | 2/1994 | Ushio et al. ............... 174/254 |
| 5,517,208 | A | * | 5/1996 | Mori et al. ................. 345/87 |
| 5,767,571 | A | | 6/1998 | Kimura et al. ............. 257/668 |
| 5,949,512 | A | * | 9/1999 | Taguchi ...................... 349/150 |
| 6,559,522 | B1 | * | 5/2003 | Kang .......................... 257/668 |
| 6,956,288 | B2 | * | 10/2005 | Ueno et al. ................. 257/735 |

2005/0015976 A1 1/2005 Hirano

FOREIGN PATENT DOCUMENTS

| | | |
|---|---|---|
| EP | 0803906 | 10/1997 |
| EP | 0 940 709 A1 | 9/1999 |
| EP | 0730186 | 8/2001 |
| EP | 0795772 | 11/2002 |
| JP | 05-323351 | 7/1993 |
| JP | 08-241044 | 9/1996 |
| JP | 2000-183470 | 6/2000 |
| JP | 2002-031813 | 1/2002 |

* cited by examiner

*Primary Examiner*—David Nelms
*Assistant Examiner*—W. Patty Chen
(74) *Attorney, Agent, or Firm*—Jianq Chyun IP Office

(57) ABSTRACT

A display including a display panel, a circuit board and a tape carrier package structure is provided. The circuit board is disposed at the display panel. The tape carrier package structure includes a substrate having an opening, a plurality of leads, a chip, and a blocking bar. The substrate is between the display panel and the circuit board. A plurality of leads, each having an inner lead and outer lead, are disposed around the opening on the substrate. A portion of the outer leads is electrically connected to the display panel, and another portion is electrically connected to the circuit board. The chip has a plurality of contact points, and is disposed at the opening of the substrate. The contact points are electrically connected to the inner leads. Moreover, the blocking bar is disposed on the substrate between the chip and the display panel.

4 Claims, 7 Drawing Sheets

DISPLAY AND TAPE CARRIER PACKAGE STRUCTURE

BACKGROUND OF THE INVENTION

1. Field of the Invention

The present invention generally relates to a display. More particularly, the present invention relates to a display with a tape carrier package (TCP) structure or with a package structure of chip on flexible printed circuit board (chip on FPC, COF).

2. Description of Related Art

As the video technology advances drastically, a variety of display devices has been developed. In general, a conventional display includes a display panel for displaying image. The display panel is controlled by a circuit board. The chip on the circuit board computes and provides digital signals in order to control the pixels of the display panel for displaying image and to generate a frame of image. In general, a package structure has to be electrically connected between the circuit board and the display panel.

A conventional tape carrier package (TCP) structure or a chip on flexible printed circuit board (chip-on-FPC, COF) package structure is a design for packaging the semiconductor chip to a small size unit. The technology is broadly used to package the liquid crystal display driving integrated chip (LDI).

FIG. 1 is a schematic top view of a display using a conventional tape carrier package structure. Referring to FIG. 1, a display 100 includes a display panel 110, at least a circuit board 120 and at least a tape carrier package structure 130. The circuit board 120 is disposed at a side of the display panel 110, and the tape carrier package structure 130 is electrically connected between the display panel 110 and the circuit board 120.

FIG. 2 is a schematic cross-sectional view of the tape carrier package structure along line A-A' of FIG. 1. Referring to FIG. 1 and FIG. 2, the tape carrier package structure 130 includes a substrate 132, a plurality of leads 134 and a chip 136. The substrate 132 has an opening 132a. The leads 134 are disposed around the opening 132a of the substrate 132, and each lead 134 has an inner lead 134a and an outer lead 134b. A portion of the outer lead 134b is electrically connected to the display panel 110 and another portion of the outer lead 134b is electrically connected to the corresponding circuit board 120 by using anisotropic conductive film (ACF) 140. The chip 136 is disposed close to the opening 132a of the substrate 132. In addition, the chip 136 has a plurality of contact points 136a electrically connected to the inner lead 134a. Moreover, a sealing material 150 covers the chip 136 of the tape carrier package structure 130.

However, in the package process of the display panel 110 and the circuit board 120 using the tape carrier package structure 130, the influence of particles on the yield of the package process should be considered.

FIG. 3 is a schematic cross-sectional side view of the tape carrier package structure, a portion of the display panel and a portion of the circuit board along line B-B' of FIG. 1. Referring to FIG. 3, a conventional tape carrier package structure 130 is electrically connected to the display panel 110 and the circuit board 120 by using the anisotropic conductive film 140. However, a bevel region 112 is generally designed on the display panel 110. Since variation may occur when bonding the package structure and the display panel 110, in general, the anisotropic conductive film 140 is moved towards the inner side of the display panel 110 for adhesion so that the anisotropic conductive film 140 may be far away from the bevel region 112.

However, as described above, a larger space is formed in the bonding region of the display panel 110 and the anisotropic conductive film 140. Consequently, particles 160 are easily to fall in the space. Accordingly, abnormal short circuit or open circuit may be occurred between the package structure 130 and the display panel 110.

SUMMARY OF THE INVENTION

Therefore, the present invention is directed to a display for preventing accumulation of particles in the region between the display panel and the package structure. Therefore, the yield of manufacturing the display may be enhanced and the lifetime of the display is also increased.

In addition, the present invention is also directed to a carrier package structure for preventing accumulation of particles in the region between the display panel and the package structure. Therefore, the yield of manufacturing the display may be enhanced and the lifetime of the display is also increased.

The present invention provides a display. The display comprises a display panel, at least a circuit board and at least a tape carrier package structure. The circuit board is disposed at a side of the display panel, and the tape carrier package structure is disposed between the display panel and the circuit board. The tape carrier package structure comprises a substrate, a plurality of leads, a chip and a blocking bar. The substrate includes an opening. The leads are disposed around an opening of the substrate, and each of the leads comprises an inner lead and an outer lead. In addition, a portion of the outer leads is electrically connected to the display panel, and another portion of the outer leads is electrically connected to the circuit board correspondingly. The chip is disposed at the opening of the substrate and comprises a plurality of contact points electrically connected to the inner leads. The blocking bar is disposed on the substrate between the chip and the display panel.

In one embodiment of the present invention, the tape carrier package structure further comprises another blocking bar disposed on the substrate between the chip and the circuit board.

In one embodiment of the present invention, the blocking bar and the substrate are formed as an integral structure.

In another embodiment of the present invention, the blocking bar is adhered to the substrate.

In one embodiment of the present invention, the display further comprises an anisotropic conductive film disposed between the outer leads of the tape carrier package structure and the display panel so that the tape carrier package structure and the display panel are electrically connected.

In one embodiment of the present invention, the display further comprises an anisotropic conductive film disposed between the outer leads of the tape carrier package structure and the circuit board so that the tape carrier package structure and the circuit board are electrically connected.

In one embodiment of the present invention, the display further comprises a sealing material covering the chip of the tape carrier package structure.

The present invention further provides a display. The display comprises a display panel and at least a package structure of chip on FPC. The package structure of chip on FPC is disposed at a side of the display panel. Each package structure of chip on FPC comprises a flexible printed circuit board, a chip and a blocking bar. The flexible printed circuit board comprises at least two isolation layers and at least a conducting wire layer disposed between the two isolation layers. The chip is disposed on the flexible printed circuit board. Wherein, the chip comprises a plurality of contact points electrically connected to the conductive layer of the flexible printed circuit board. The blocking bar is disposed on the isolation layer of the flexible printed circuit board between the chip and the display panel.

In one embodiment of the present invention, the blocking bar and the isolation layer of the flexible printed circuit board may be formed as an integral structure.

In another embodiment of the present invention, the blocking bar may be adhered to the isolation layer of the flexible printed circuit board.

In one embodiment of the present invention, the display may further comprise an anisotropic conductive film disposed between the package structure of chip on FPC and the display panel so that the package structure of chip on FPC and the display panel are electrically connected.

The present invention provides a tape carrier package structure. The tape carrier package structure comprises a substrate, a plurality of leads, a chip and a blocking bar. The substrate has an opening. A plurality of leads is disposed around the opening of the substrate. Each lead comprises an inner lead and an outer lead. The chip is disposed at the opening of the substrate and comprises a plurality of contact points electrically connected to the inner leads. The blocking bar is disposed on the substrate at a side of the chip.

In one embodiment of the present invention, the tape carrier package structure further comprises another blocking bar disposed on the substrate at another side of the chip.

In one embodiment of the present invention, the blocking bar and the substrate may be formed as an integral structure.

In another embodiment of the present invention, the blocking bar may be adhered to the substrate.

In one embodiment of the present invention, the tape carrier package structure may further comprise an anisotropic conductive film disposed between the outer leads of the tape carrier package structure and the display panel so that the tape carrier package structure and the display panel are electrically connected.

In one embodiment of the present invention, the tape carrier package structure may further comprise an anisotropic conductive film disposed between the outer leads of the tape carrier package structure and the circuit board so that the tape carrier package structure and the circuit board may be electrically connected.

In one embodiment of the present invention, the tape carrier package structure may further comprise a sealing material for covering the chip of the tape carrier package structure.

Accordingly, in the present invention, since a carrier package structure with blocking bar or a package structure of chip on FPC with blocking bar is provided, when the display is packaged, particles are prevented from entering the region between the panel and the package structure. Therefore, the problem of short circuit or open circuit between the package structure and the display panel is prevented, the yield of manufacturing the display is improved and the lifetime of the display is enhanced.

One or part or all of these and other features and advantages of the present invention will become readily apparent to those skilled in this art from the following description wherein there is shown and described one embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
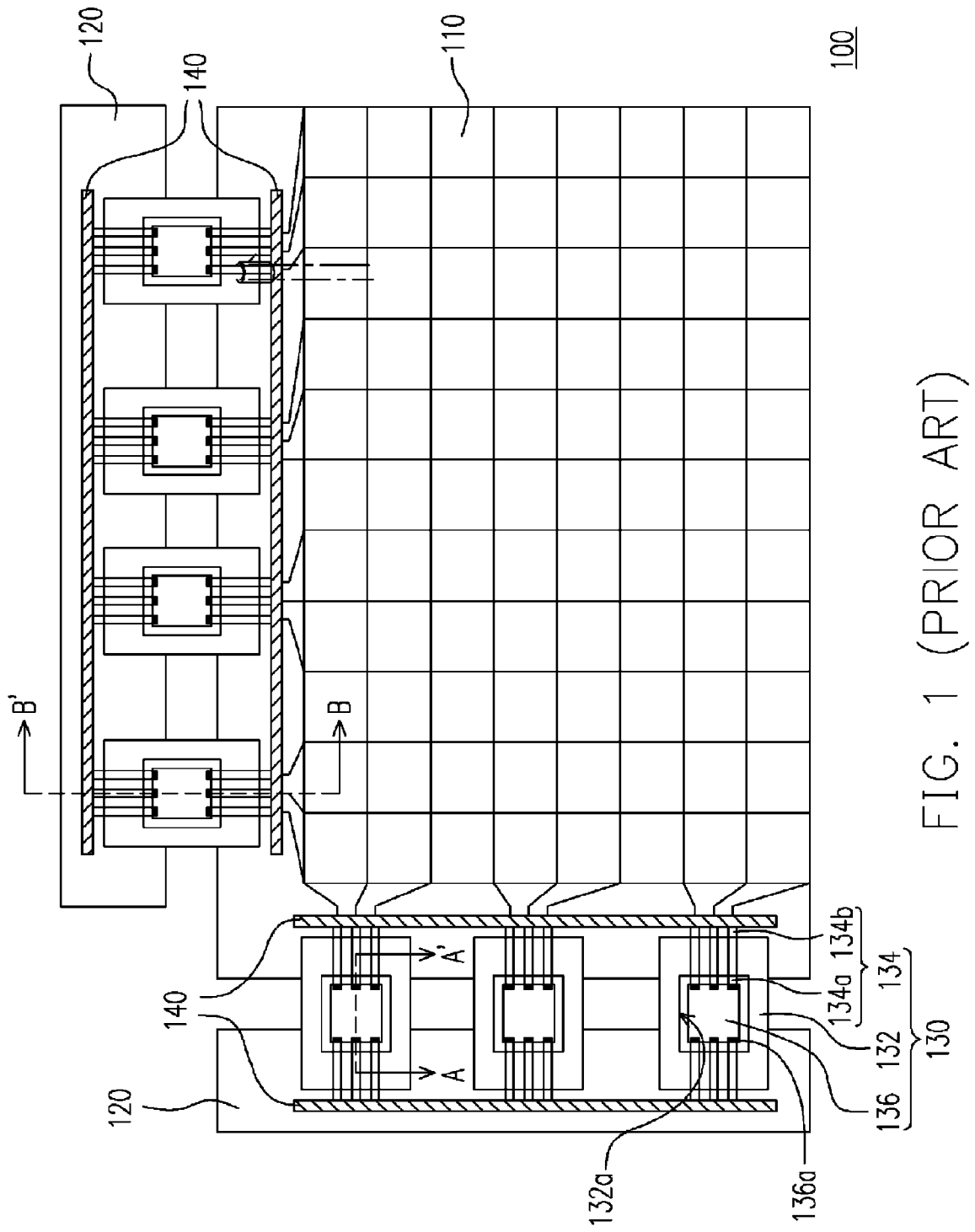
FIG. 1 is a schematic top view of a display using a conventional tape carrier package structure.
Figure 2:
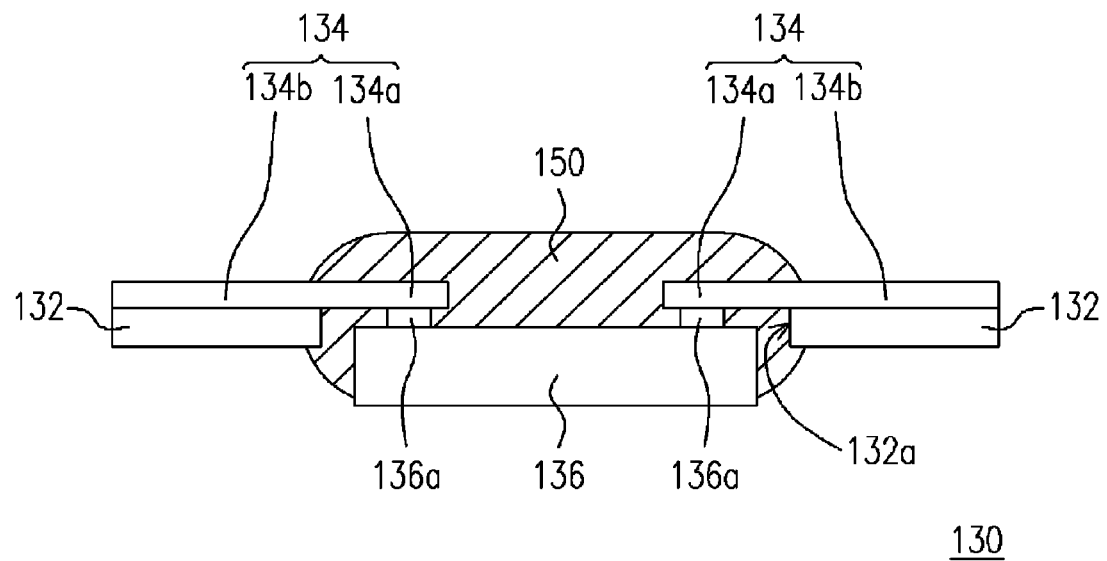
FIG. 2 is a schematic cross-sectional view of the tape carrier package structure along line A-A' of FIG. 1.
Figure 3:
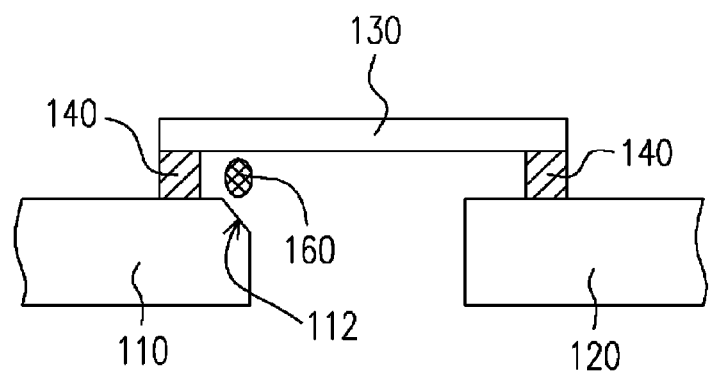
FIG. 3 is a schematic cross-sectional side view of the tape carrier package structure, a portion of the display panel and a portion of the circuit board along line B-B' of FIG. 1.
Figure 4:
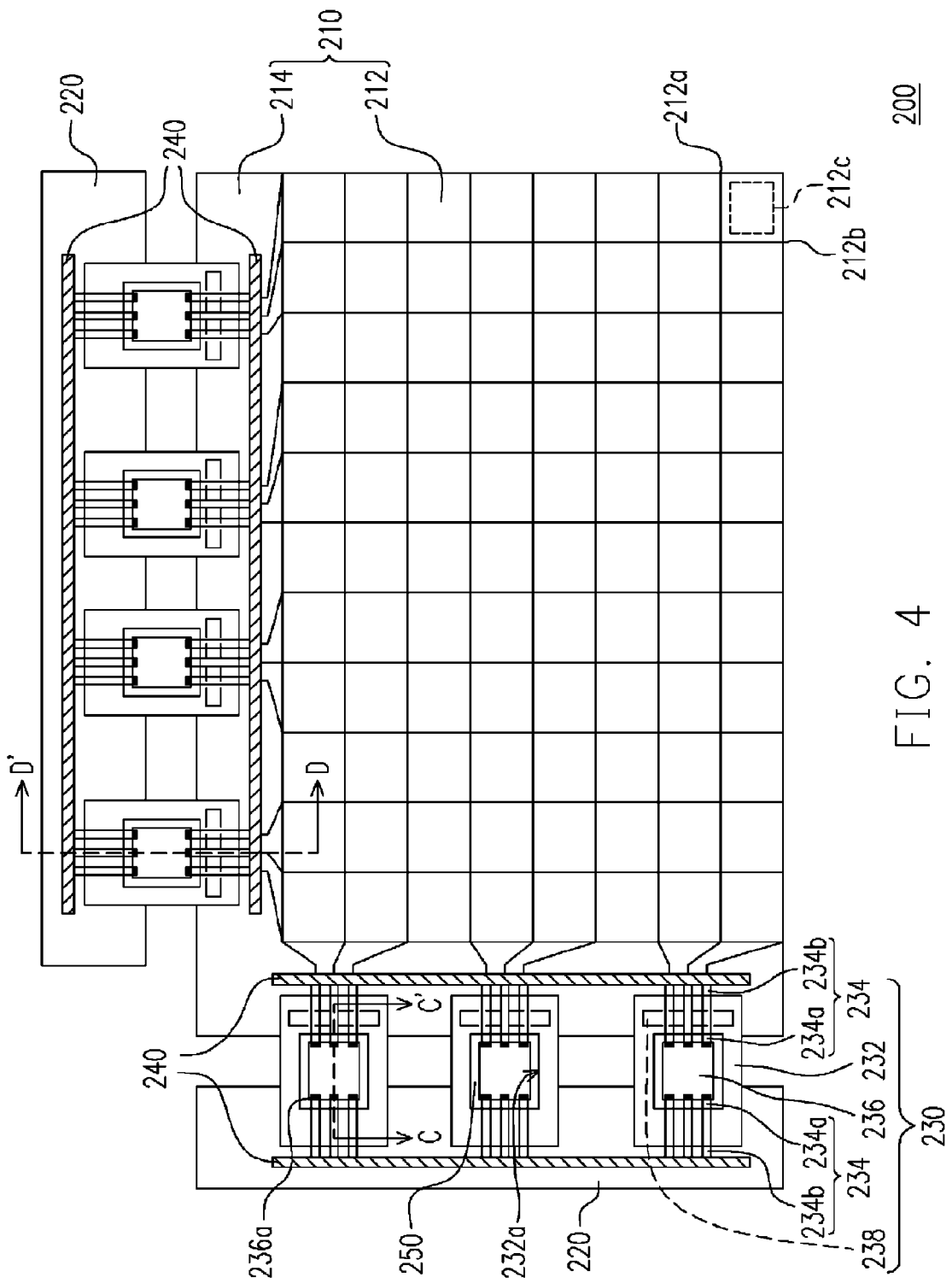
FIG. 4 is a schematic top view of a display according to one embodiment of the present invention.

FIG. 4 is a schematic top view of a display according to one embodiment of the present invention. Referring to FIG. 4, a display 200 comprises a display panel 210, at least a circuit board 220 and at least a tape carrier package structure 230. The display panel 210 includes a display area 212 and a non-display area 214. The display area 212 includes a plurality of scan lines 212a and a plurality of data lines 212b. A plurality of pixel units 212c are defined by the scan lines 212a and the data lines 212b. If the display 200 is a liquid crystal display (LCD), each pixel unit 212c comprises, for example, a thin film transistor (TFT) (not shown), a liquid crystal layer (not shown) and a color filter (not shown). The pixel unit 212c displays images via the voltage signals provided by the scan lines 212a and the data lines 212b. In addition, some peripheral circuits disposed in the non-display area 214 may be adopted for electrically connection with the tape carrier package structure 230.

Referring to FIG. 4, the circuit board 220 is disposed at a side of the display panel 210, and the tape carrier package structure 230 is disposed between the display panel 210 and circuit board 220. Therefore, the tape carrier package structure 230 is used for electrically connecting the display panel 210 and the circuit board 220.

Figure 5:
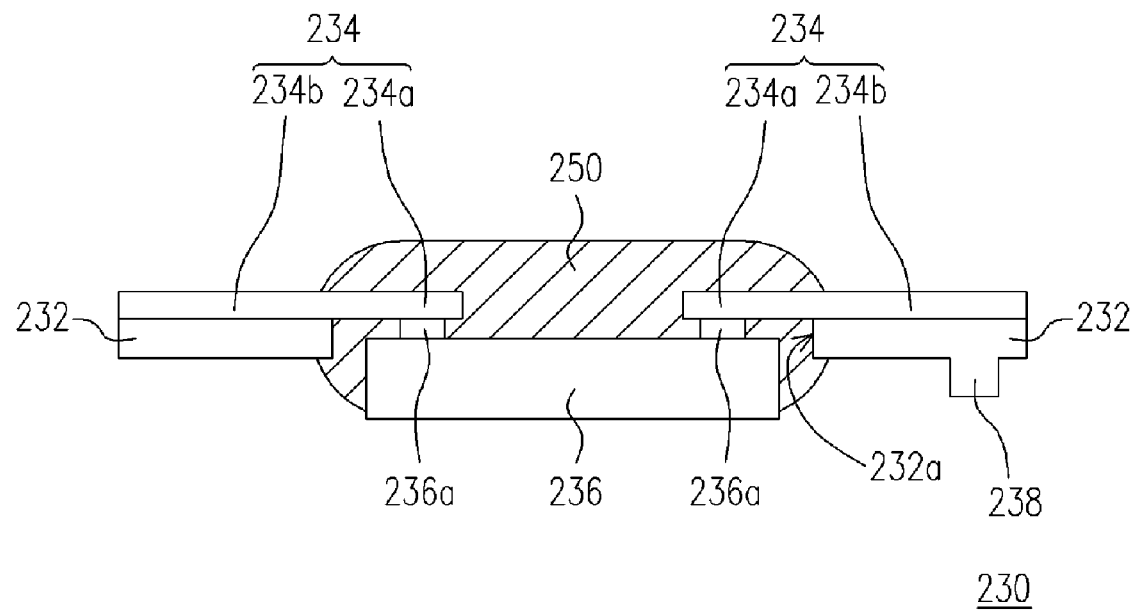
FIG. 5 is a schematic cross-sectional view of the tape carrier package structure along line C-C' of FIG. 4.

FIG. 5 is a schematic cross-sectional view of the tape carrier package structure along line C-C' of FIG. 4. Referring to FIG. 5, the tape carrier package structure 230 comprises a substrate 232, a plurality of leads 234, a chip 236 and a blocking bar 238. The substrate 232 comprises an opening 232a. The leads 234 are disposed around the opening 232a of the substrate 232, wherein each lead 234 comprises an inner lead 234a and an outer lead 234b. As shown in FIG. 4, by using the anisotropic conductive film 240, a portion of the outer leads 234b are electrically connected to the display panel 210, and another portion of the outer leads 210 are electrically connected to the corresponding circuit board 220.

Referring to FIG. 5, the chip 236 is disposed around the opening 232a of the substrate 232 and comprises a plurality of contact points 236a. Wherein, the contact points 236a are electrically connected to the inner lead 234a. In one embodiment of the present invention, a sealing material 250 may further provide for covering the chip 236 in the tape carrier package structure 230 to avoid the damage of the chip 236 and the contact points 236a contacted to the inner leads 234a by moisture or oxygen. The blocking bar 238 shown in FIG. 4 and FIG. 5 will be described in detail as follows.

Figure 6:
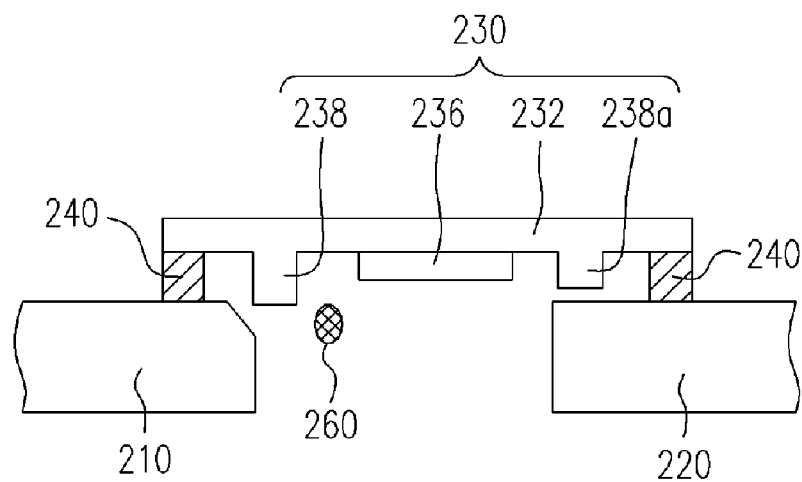
FIG. 6 is a schematic cross-sectional side view of the tape carrier package structure, a portion of the display panel and a portion of the circuit board along line C-C' of FIG. 4.
Figure 7:
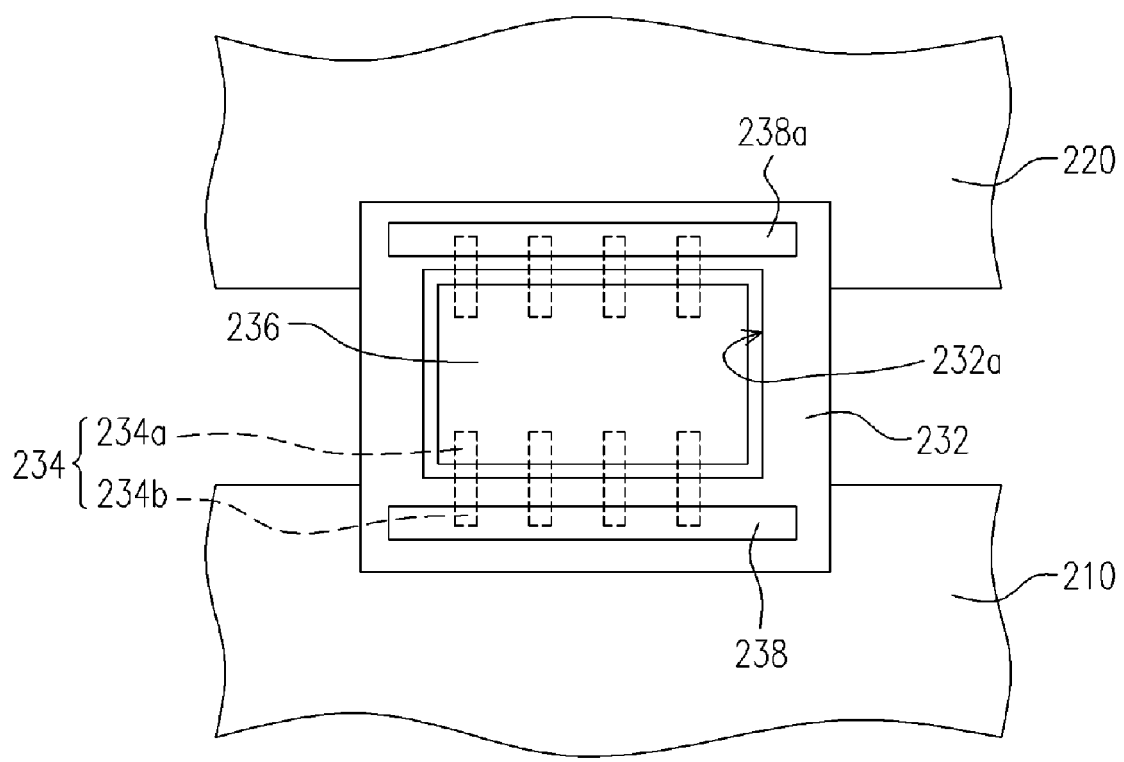
FIG. 7 is a schematic local back-side view of a tape carrier package structure of FIG. 4.

FIG. 6 is a schematic cross-sectional side view of the tape carrier package structure, a portion of the display panel and a portion of the circuit board along line C-C' of FIG. 4. FIG. 7 is a schematic local back-side view of a tape carrier package structure of FIG. 4. Referring to FIG. 6 and FIG. 7, note that the blocking bar 238 disposed over the substrate 232 between the chip 236 and the display panel 210 is to prevent particles 260 from entering the region between the display panel 210 and the carrier package structure 230. Therefore, the package structure with the blocking bar 238 eliminates the abnormal short circuit or open circuit due to the particles 260.

Referring to FIG. 6 and FIG. 7, in another embodiment of the present invention, each tape carrier package structure 230 may further comprise another blocking bar 238a disposed over the substrate 232 between the chip 236 and the circuit board 220 to prevent the particles 260 from entering the region between the carrier package structure 230 and the circuit board 220. In other words, if the two blocking bar 238, 238a are disposed simultaneously, prevention of the particles 260 entering the carrier package structure 230 can be improved.

In addition, In one embodiment of the present invention, the blocking bar 238 and the substrate 232 may be, for example, formed as an integral structure. In other words, the blocking bar 238 may be formed on the carrier tape of the manufacturing tape carrier package structure 230 when the carrier tape is manufactured. Moreover, the blocking bar 238 may also be adhered on the substrate 232.

Referring to FIG. 4 and FIG. 6, in one embodiment of the present invention, an anisotropic conductive film 240 may further be disposed between the outer lead 234b of each tape carrier package structure 230 and the display panel 210 so that the tape carrier package structure 230 and the display panel 210 can be electrically connected. In addition, another anisotropic conductive film 240 may also be disposed between the outer lead 234b of each tape carrier package structure 230 and the circuit board 220 so that the tape carrier package structure 230 and the circuit board 220 can be electrically connected. The anisotropic conductive film 240 comprises a gel composed of metal particles and polymer material. The carrier package structure 230, the display panel 210 and the circuit board 220 can be electrically connected for transmitting electronic signals by using the anisotropic conductive film 240.

In the present invention, since the tape carrier package structure 230 includes a blocking bar 238, and the blocking bar 238 may be disposed on the substrate 232 at a side of the chip 236a, so that the blocking bar 238 may be provided for preventing the entering of the particles 260 into the region between the chip 236 and the display panel 210. Therefore, the abnormal short circuit or open circuit due to the particles 260 can be avoided.

In another embodiment of the present invention, each tape carrier package structure 230 may comprise, for example, another blocking bar 238a (as shown in FIG. 6) disposed on the substrate 232 at another side of the chip 236. The blocking bar 238a and substrate 232 may be formed as an integral structure or adhered on the substrate 232. The tape carrier package structure 230 with the blocking bar will effectively block particles. Therefore, the tape carrier package structure 230 of the present invention will enhance the yield of electricity contact. Thus, the present invention may not only be applied to various displays, but also to package structures such as mobile phones, notebooks or other electronic products so that the stability of the electronic products can be enhanced.

Figure 8:
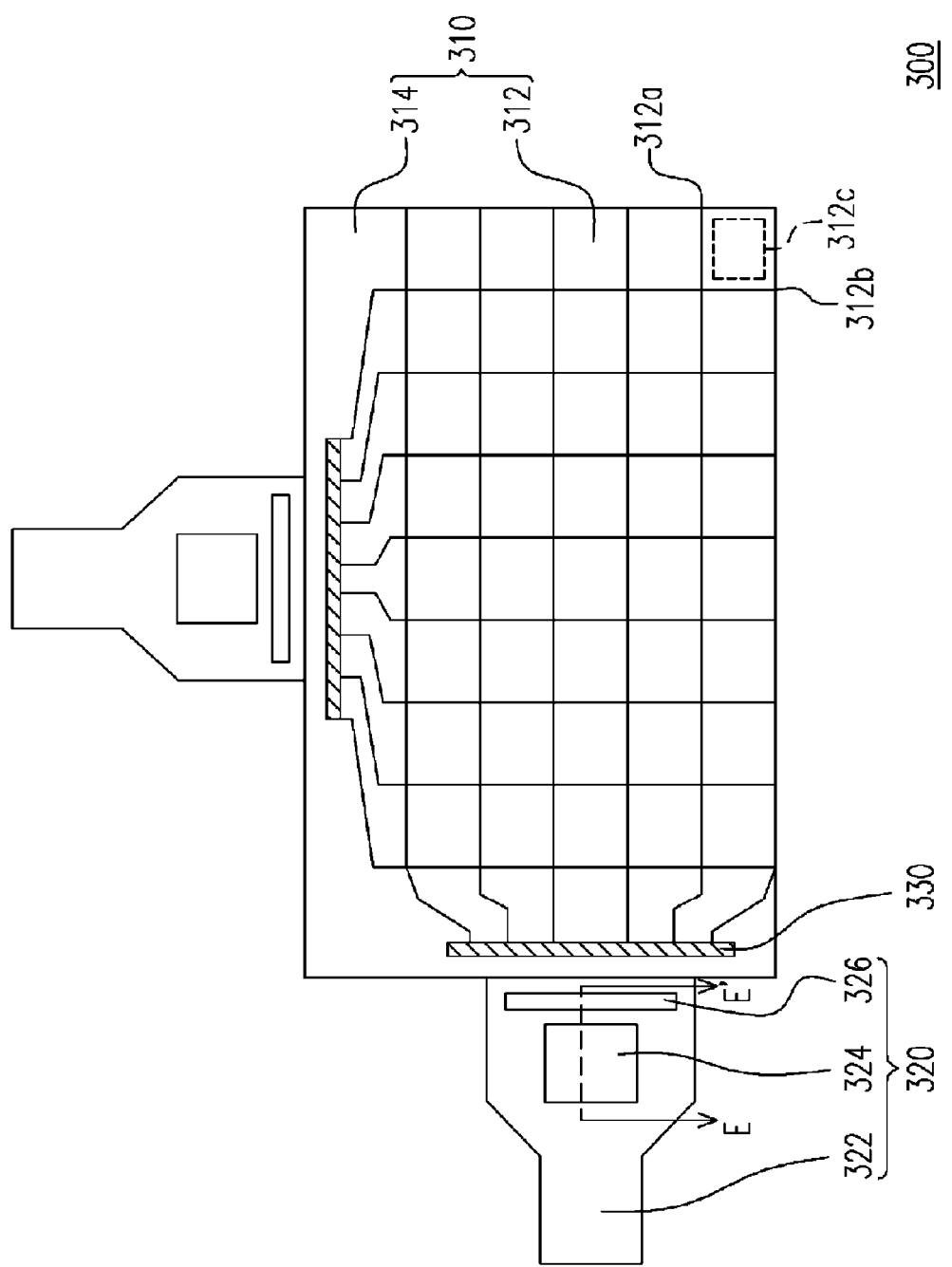
FIG. 8 is a schematic view of a display packaged by chip on FPC structure according to one embodiment of the present invention.

FIG. 8 is a schematic view of a display packaged by chip on FPC structure according to one embodiment of the present invention. Referring to FIG. 8, the display 300 comprises a display panel 310 and at least a package structure 320 of chip on flexible printed circuits board (chip on FPC, COF). The display panel 310 comprises a display area 312 and a non-display area 314. The display area 312 comprises a plurality of scan lines 312a and a plurality of data lines 312b. Wherein, a plurality of pixel units 312c is defined by the scan lines 312a and the data lines 312b. If the display 300 is a liquid crystal display, each pixel unit 312c comprises, for example, a thin film transistor (TFT) (not shown), a liquid crystal layer (not shown) and a color filter (not shown). If the display 300 is an organic electroluminescence display (OLED), thus the pixel unit 312c comprises, for example, an active component (not shown) and an organic electroluminescence (OEL) component (not shown). Accordingly, the pixel unit 312c displays images by the electronic signals transmitted from the scan lines 312a and the data lines 312b.

Referring to FIG. 8, the package structure 320 of chip on FPC is disposed at a side of the display panel 310. Each package structure 320 of the chip on FPC includes a flexible printed circuit board 322, a chip 324 and a blocking bar 326.

Figure 9:
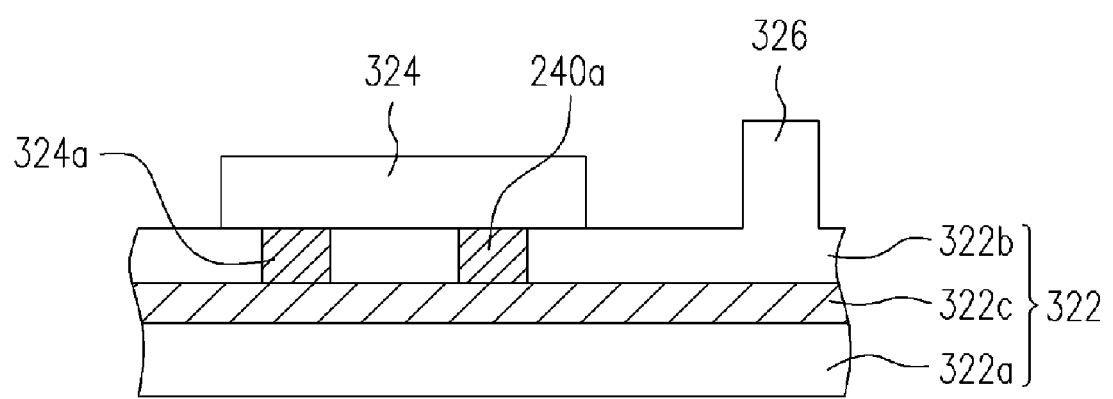
FIG. 9 is a schematic cross-sectional view of a flexible printed circuit board along line E-E' of FIG. 8.

FIG. 9 is a schematic cross-sectional view of a flexible printed circuit board along line E-E' of FIG. 8. Referring to FIG. 9, the flexible printed circuit board 322 comprises at least two isolation layers 322a and 322b and at least a conducting wire layer 322c disposed between the two isolation layers 322a and 322b. The chip 324 is disposed over the flexible printed circuit board 322. In addition, the chip 324 comprises a plurality of contact points 324a electrically connected to the conductive layer 322c of the flexible printed circuit board 322. Referring to FIG. 8, note that the blocking bar 326 is disposed on the isolation layer 322b of the flexible printed circuit board 322 between the chip 324 and the display panel 310. The blocking bar 326 will prevent particles (not shown) from entering the region between the display panel 310 and the chip 324 so that the abnormal short circuit or open circuit due to the particles can be avoided.

Next, referring to FIG. 9, in one embodiment of the present invention, the blocking bar 326 and the isolation layer 322b of the flexible printed circuit board 322 may be formed as an integral structure or may be adhered to the isolation layer 322b of the flexible printed circuit board 322.

Referring to FIG. 8, in one embodiment of the present invention, an anisotropic conductive film 330 may further be disposed between the package structure 320 of the chip on FPC and the display panel 310 so that the package structure 320 of the chip on FPC and the display panel 310 may be electrically connected for transmitting electronic signals.

In summary, the display and tape carrier package structure of the present invention have the following advantages.

(1) The package structure of the display of the present invention includes blocking bar for preventing particles from entering the region between the chip and the panel. Therefore, the problem of abnormal short circuit or open circuit of the electronic components can be avoided.

(2) Application of the package structure of the present invention will enhance the yield of manufacturing the display so that the lifetime of the display can also be improved.

(3) The package structure of the present invention can be adopted for the package process of other electronic products to upgrade the stability of the electronic products.

The foregoing description of the embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display, comprising:
   a display panel; and
   a package structure of chip on a flexible printed circuit board (chip on FPC) comprising:
      a flexible printed circuit board, disposed on a side of the display panel, wherein the flexible printed circuit board comprises a plurality of isolation layers and a conductive layer disposed between the isolation layers;
      a chip, comprising a plurality of contact points, disposed on the flexible printed circuit board, wherein the contact points are electrically connected to the conductive layer; and
      a protrusion, disposed on the flexible printed circuit board between the chip and the isolation layers, wherein the protrusion material composition comprises a non-conducting material, the protrusion is adhered onto one of the isolation layers, a part of the one of the isolation layers covers the conductive layer, and the part of the one of the isolation layers without any slit or blank is located directly under the protrusion and contacts the protrusion.

2. The display of claim 1, wherein the protrusion comprises a strip shape.

3. The display of claim 1, wherein the protrusion comprises a plurality of block shapes.

4. The display of claim 1, wherein the protrusion material composition comprises an organic polymer material.

\* \* \* \* \*